United States Patent
Cheng et al.

(10) Patent No.: US 9,583,557 B2
(45) Date of Patent: Feb. 28, 2017

(54) INTEGRATED CIRCUITS INCLUDING A MIMCAP DEVICE AND METHODS OF FORMING THE SAME FOR LONG AND CONTROLLABLE RELIABILITY LIFETIME

(71) Applicant: GLOBALFOUNDRIES, Inc., Grand Cayman (KY)

(72) Inventors: Lili Cheng, Rexford, NY (US); Dina H. Triyoso, Mechanicville, NY (US); Jeasung Park, Ballston SPA, NY (US); David Paul Brunco, Latham, NY (US); Robert Fox, Greenfield Center, NY (US); Sanford Chu, Poughkeepsie, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/835,278

(22) Filed: Aug. 25, 2015

(65) Prior Publication Data
US 2016/0064472 A1 Mar. 3, 2016

Related U.S. Application Data

(60) Provisional application No. 62/041,933, filed on Aug. 26, 2014.

(51) Int. Cl.
*H01L 21/00* (2006.01)
*H01L 49/02* (2006.01)
(Continued)

(52) U.S. Cl.
CPC .......... *H01L 28/60* (2013.01); *G06F 17/5068* (2013.01); *H01L 21/02181* (2013.01);
(Continued)

(58) Field of Classification Search
CPC ............... H01L 28/60; H01L 21/02181; H01L 21/02189; G06F 17/5068
See application file for complete search history.

(56) References Cited

U.S. PATENT DOCUMENTS 7,205,165 B1 * 4/2007 Salman .................. H01L 22/14
257/E21.267
7,851,793 B2 * 12/2010 Wang ................. G01R 31/2858
257/48

(Continued)

OTHER PUBLICATIONS

Tu et al "Characterization of Comparison of High-k Metal-Insulator-Metal (MiM) Capacitors in 0.13 um Cu BEOL for Mixed-Mode and RF Applications", 2003 Symposium on VLSI Technology Digest of Technical Papers 6B-4 (pp. 79-80).*
(Continued)

*Primary Examiner* — Laura Menz
(74) *Attorney, Agent, or Firm* — Lorenz & Kopf, LLP

(57) ABSTRACT

Integrated circuits including a MIMCAP device and methods of forming the integrated circuits are provided. An exemplary method of forming an integrated circuit including a MIMCAP device includes pre-determining a thickness of at least one of a bottom high-K layer or a top high-K layer of the MIMCAP device, followed by fabricating the MIMCAP device. The pre-determined thickness is established based upon a pre-determined TDDB lifetime for the MIMCAP device and a minimum target capacitance density at an applied voltage bias to be employed for the MIMCAP device. The MIMCAP device includes a bottom electrode and a dielectric layer disposed over the bottom electrode. The dielectric layer includes a stack of individual layers including the bottom high-K layer, the top high-K layer, and a lower-K layer sandwiched therebetween. At least one of the bottom high-K layer or the top high-K layer has the pre-determined thickness.

14 Claims, 1 Drawing Sheet

(51) Int. Cl.
*H01L 23/522* (2006.01)
*H01L 21/02* (2006.01)
*G06F 17/50* (2006.01)

(52) U.S. Cl.
CPC .... *H01L 21/02189* (2013.01); *H01L 23/5226* (2013.01); *H01L 2924/0002* (2013.01)

(56) References Cited

U.S. PATENT DOCUMENTS

| | | | | |
|---|---|---|---|---|
| 2008/0038851 | A1* | 2/2008 | Koyama | G01R 31/2623 |
| | | | | 438/17 |
| 2008/0122476 | A1* | 5/2008 | Wang | G01R 31/2858 |
| | | | | 324/762.05 |
| 2008/0318378 | A1* | 12/2008 | Wu | H01L 27/10852 |
| | | | | 438/253 |
| 2011/0031981 | A1* | 2/2011 | Tsujikawa | G01R 31/2623 |
| | | | | 324/554 |
| 2013/0280873 | A1* | 10/2013 | Erben | H01L 21/02181 |
| | | | | 438/239 |
| 2015/0311273 | A1* | 10/2015 | Lin | H01L 28/40 |
| | | | | 257/532 |
| 2016/0064472 | A1* | 3/2016 | Cheng | H01L 28/60 |
| | | | | 257/532 |

OTHER PUBLICATIONS

Shiniriki et al, "Promising Storage Capacitor Structures with Thin Ta2O5 Film for Low-Power High-Density DRAM's", IEEE Transactions on Electron Devices. vol. 37, No. 9. Sep. 1990 (pp. 1939-1947).*

* cited by examiner

INTEGRATED CIRCUITS INCLUDING A MIMCAP DEVICE AND METHODS OF FORMING THE SAME FOR LONG AND CONTROLLABLE RELIABILITY LIFETIME

CROSS-REFERENCE TO RELATED APPLICATIONS

This application claims the benefit of U.S. Provisional Application No. 62/041,933, filed Aug. 26, 2014.

TECHNICAL FIELD

The technical field generally relates to integrated circuits including a Metal-Insulator-Metal Capacitor (MIMCAP) device and methods of forming the same, and more particularly relates to integrated circuits including a MIMCAP device and methods of forming the integrated circuits with the MIMCAP device optimized for sufficiently long reliability lifetimes while attaining a minimum target capacitance density at an applied voltage bias for the MIMCAP device.

BACKGROUND

On-chip capacitors are common components of integrated circuits. These capacitors are used for a variety of purposes: illustrative examples include bypass and capacitive matching as well as coupling and decoupling. The design and implementation of capacitor structures in integrated circuits may be dependent upon one or more symmetrical structural, target circuit quality and low parasitic resistance performance characteristics.

Metal-Insulator-Metal Capacitor (MIMCAP) devices are one type of on-chip capacitor and are generally formed during back-end-of-line (BEOL) processing. In integrated-circuit fabrication lines, front-end-of-line (FEOL) conventionally refers to earlier process stages that directly modify the semiconductor substrate or the immediate contacts to it; for example, dopant diffusion and implantation, sputtering of gate films, oxidations, and the patterning steps associated with these. In contradistinction, the BEOL is metallization for interconnects and vias (vertical interconnects between planar interconnects) and associated non-conducting depositions and growths (for example, polymers, glasses, oxides, nitrides, and oxinitrides) for electrical isolation, dielectrics (for capacitance), diffusion barriers, and mechanical passivation (in particular, to prevent failure of interconnects by electromigration and stress migration). FEOL and BEOL are used to refer to the levels of an IC fabricated in the corresponding stages. BEOL is the metallization layers and associated insulating layers, and FEOL everything below that (mostly transistors).

It is often difficult to form MIMCAP devices that meet target minimum capacitance requirements at an applied voltage bias for the MIMCAP device while also achieving sufficiently long reliability lifetimes given constraints during BEOL processing. Optimal MIMCAP fabrication details and structure will in general depend upon the reliability lifetime requirements (typically in years), the magnitude of the applied voltage, and whether reliability is required for voltage drops across the device from top electrode to bottom electrode that are positive only, negative only, or either positive or negative (bi-directional).

Accordingly, it is desirable to provide integrated circuits including a MIMCAP and methods of forming the same with the MIMCAP having a specified reliability lifetime while still attaining a minimum target capacitance density at an applied voltage bias for the MIMCAP device. Furthermore, other desirable features and characteristics will become apparent from the subsequent detailed description and the appended claims, taken in conjunction with the accompanying drawings and this background.

BRIEF SUMMARY

Integrated circuits including a metal-insulator-metal capacitor (MIMCAP) device and methods of forming such integrated circuits are provided herein. The MIMCAP device includes a bottom electrode, a dielectric layer disposed over the bottom electrode, and a top electrode disposed over the dielectric layer. The dielectric layer includes a stack of individual layers including the bottom high-K layer, the top high-K layer, and a lower-K layer sandwiched between the bottom high-K layer and the top high-K layer.

In an embodiment, a method of forming an integrated circuit including a MIMCAP device includes pre-determining a thickness of at least one of a bottom high-K layer or a top high-K layer of the MIMCAP device. The pre-determined thickness is established based upon a pre-determined time-dependent dielectric breakdown (TDDB) lifetime for the MIMCAP device and a minimum target capacitance density at an applied voltage bias to be employed for the MIMCAP device. The MIMCAP device is fabricated after pre-determining the thickness of at least one of the bottom high-K layer or the top high-K layer. At least one of the bottom high-K layer or the top high-K layer has the pre-determined thickness.

In another embodiment, a method of forming an integrated circuit including a MIMCAP device includes establishing a minimum target capacitance density at an applied voltage bias to be employed for the MIMCAP device. A pre-determined TDDB lifetime for the MIMCAP device is also established. A thickness of at least one of a bottom high-K layer or a top high-K layer of the MIMCAP device is pre-determined, wherein the pre-determined thickness is established based upon the pre-determined TDDB lifetime for the MIMCAP device and the minimum target capacitance density at the applied voltage bias to be employed for the MIMCAP device. The MIMCAP device is fabricated after pre-determining the thickness of at least one of the bottom high-K layer or the top high-K layer. At least one of the bottom high-K layer or the top high-K layer has the pre-determined thickness.

In another embodiment, an integrated circuit includes a base substrate and a lower metallization layer disposed over the base substrate. A MIMCAP device is disposed over the lower metallization layer with a first dielectric layer sandwiched between the MIMCAP device and the lower metallization layer. The bottom high-K layer, the top high-K layer, and the lower-K layer have a substantially amorphous structure.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
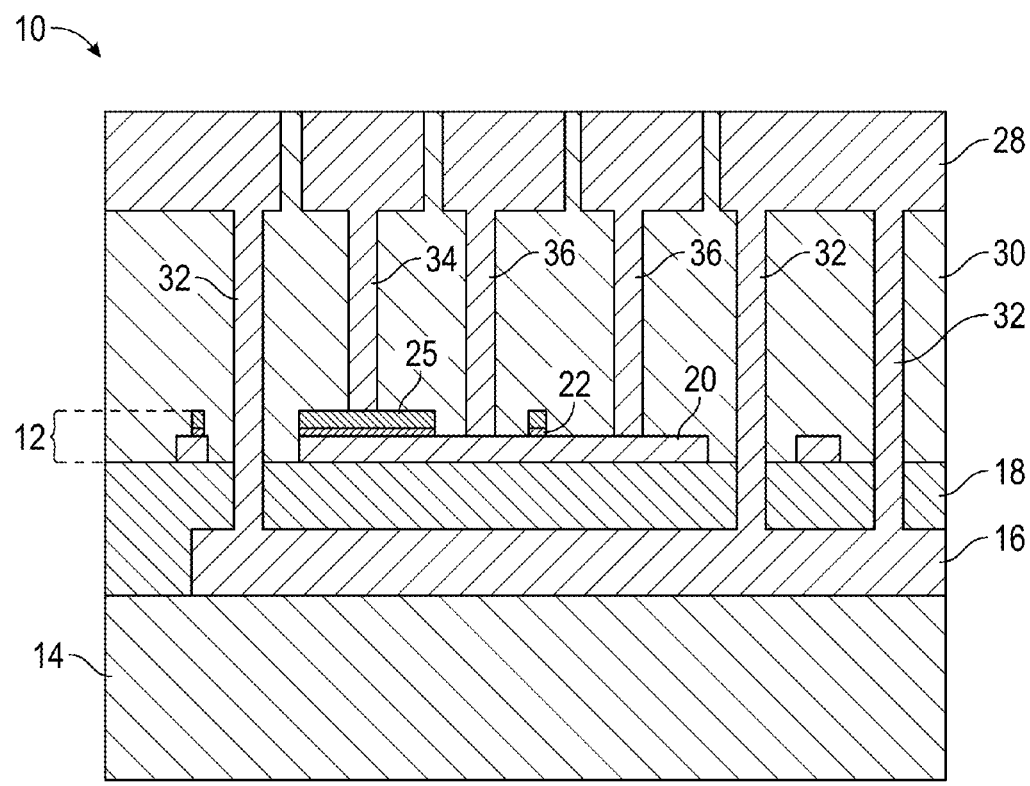
FIG. 1 is a schematic cross-sectional side view of an integrated circuit including a MIMCAP device in accordance with an embodiment.

The following detailed description is merely exemplary in nature and is not intended to limit the integrated circuits including a MIMCAP device and methods of forming the same as described herein. Furthermore, there is no intention to be bound by any theory presented in the preceding background or the following detailed description.

Embodiments of the present disclosure are generally directed to integrated circuits and methods for forming the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Integrated circuits including a Metal-Insulator-Metal Capacitor (MIMCAP) devices and methods of forming the integrated circuits including the MIMCAP device are provided herein, with the methods enabling a minimum target capacitance density at an applied voltage bias for the MIMCAP device to be achieved while minimizing leakage and achieving a specified time-dependent dielectric breakdown (TDDB) lifetime for the MIMCAP device. In particular, it has been found that layer thickness within the MIMCAP devices has strong impact on reliability lifetime, particularly layer thickness of at least one of a bottom high-k layer or a top high-K layer in the MIMCAP devices, and even more particularly a ground side layer (for MIMCAP devices configured for uni-polar voltage bias). "High-K", or high dielectric constant material, is a material that has a dielectric constant that is greater than silicon (e.g., dielectric constant of 3.9). However, for MIMCAP devices configured for bi-polar voltage bias, layer thickness of both the bottom high-k layer and a top high-K impacts reliability lifetime. Thus, thickness of at least one of the bottom high-k layer or the top high-K layer is pre-determined with the pre-determined thickness established based upon a pre-determined TDDB lifetime for the MIMCAP device and a minimum target capacitance density at an applied voltage bias to be employed for the MIMCAP device. "Pre-determining", as referred to herein, means that the thickness of the layer at issue is determined subject to the performance constraints of desired TDDB lifetime at the applied voltage. By pre-determining the thickness of the layer at issue, integrated circuits including a MIMCAP device can be formed that have a specified reliability lifetime while still attaining a minimum target capacitance density at an applied voltage bias for the MIMCAP device. Further, by pre-determining the thickness of the layer at issue, sufficient reliability lifetime can be attained with deposition and annealing temperatures during fabrication of the MIMCAP device that are compatible with BEOL processing conditions.

Referring to FIG. 1, an integrated circuit 10 including a MIMCAP device 12 is shown in accordance with an exemplary embodiment. The integrated circuit 10 includes a base substrate 14, which may be a semiconductor substrate or a partially-fabricated integrated circuit including various conventional front-end-of-line structures formed thereon. As used herein, the term "semiconductor substrate" will be used to encompass semiconductor materials that are conventionally used in the semiconductor industry. "Semiconductor materials" include monocrystalline silicon materials, such as relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like.

Figure 2:
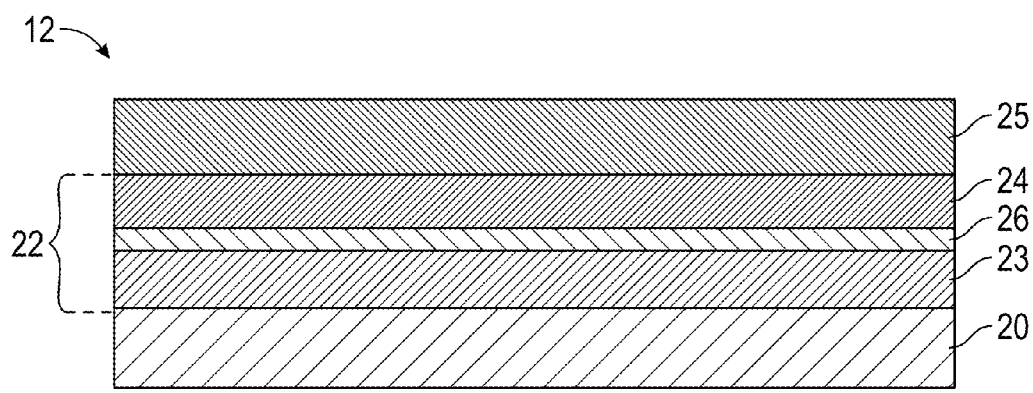
FIG. 2 is a schematic cross-sectional side view of the MIMCAP device of FIG. 1.

Referring again to FIG. 1, the integrated circuit 10 includes a lower metallization layer 16 disposed over the base substrate 14. It is to be appreciated that the "lower metallization layer", as referred to herein, can be any metallization layer in the integrated circuit 10. For example, although not shown, numerous additional levels of metal layers/interlayer dielectric layers may be disposed between the lower metallization layer 16 and the base substrate 14. The lower metallization layer 16 may include copper, an alloy, or any other conventional material known for forming metallization layers in BEOL interconnect formation. The MIMCAP device 12 is disposed over the lower metallization layer 16 with a first interlayer dielectric layer 18 sandwiched between the MIMCAP device 12 and the lower metallization layer 16. Referring to FIG. 2 with continuing reference to FIG. 1, the MIMCAP device 12 includes a bottom electrode 20, a dielectric layer 22 disposed over the bottom electrode 20, and a top electrode 25 disposed over the dielectric layer 22. In particular, the dielectric layer 22 includes a stack of individual layers including a bottom high-K layer 23, a top high-K layer 24, and a lower-K layer 26 sandwiched between the bottom high-K layer 23 and the top high-K layer 24 in accordance with conventional MIMCAP device architecture. Examples of suitable high-k dielectric materials include, but are not limited to, $HfO_2$, $ZrO_2$, or a combination thereof, which may be present in an amount of at least about 90 weight %, such as at least about 95 weight %, or such as at least about 99 weight %, based on the total weight of the bottom high-K layer 23 or the top high-K layer 24, respectively. Specific examples of high-K dielectric materials include rare earth doped $HfO_2$ (e.g. Er-doped $HfO_2$ and Y-doped $HfO_2$), rare earth doped $ZrO_2$ (e.g. Er-doped $ZrO_2$ and Y-doped $ZrO_2$), and the mixture between them. In addition, the same or different high-K dielectric material may be employed for the bottom high-K layer 23 and the top high-K layer 24. Lower-K dielectric materials that may be used for the lower-K layer 26 include materials having a lower K value than the material of the bottom high-K layer 23 and the top high-K layer 24 and may include, but are not limited to, $Al_2O_3$. An upper metallization layer 28 may be disposed over the MIMCAP device 12 with a second interlayer dielectric layer 30 sandwiched between the MIMCAP device 12 and the upper metallization layer 28. An interconnect network may be formed by selectively connecting the lower metallization layer 16, the upper metallization layer 28, and portions of the MIMCAP device 12 through vias 32, 34, 36. In particular, in embodiments, first vias 32 is in electrical communication with the lower metallization layer 16 and the upper metallization layer 28 and second vias 34, 36 are in electrical communication with the upper metallization layer 28 and the top electrode 25 or bottom electrode 20, respectively.

As alluded to above, the bottom high-k layer 23 and the top high-k layer 24 have a strong impact on reliability lifetime. The bottom high-k layer 23 and the top high-k layer 24 in the MIMCAP devices are also the bases for high capacitance density, while the sandwiched lower-k layer 26 that is disposed between the bottom high-k layer 23 and the top high-k layer 24 in the MIMCAP devices can be employed to tune for the desired capacitance density, leakage current and reliability lifetime. Maximizing of capacitance density and minimizing of leakage current are generally competing considerations; capacitance density is generally inversely proportional to thickness of the stack of dielectric layers, with a thinner stack of dielectric layers generally providing higher capacitance density. However, with a thinner stack of dielectric layers, leakage current generally increases and time-dependent dielectric breakdown (TDDB) reliability lifetime decreases.

An exemplary method of forming an integrated circuit 10 that includes the MIMCAP device 12 includes establishing layer thickness optimization within the MIMCAP devices, with the methods optionally compatible with back-end-of-line (BEOL) processing at relatively low temperatures of from about 300 to about 450° C. In an embodiment, a minimum target capacitance density at an applied voltage bias to be employed for the MIMCAP device is established. For example, integrated circuit design software may be employed by a computer to conduct the layer thickness optimization and the minimum target capacity density and, optionally, the applied voltage bias may be entered into the computer. Additionally, a pre-determined time-dependent dielectric breakdown (TDDB) lifetime for the MIMCAP device may be established, likewise by entering such data into the computer. However, it is to be appreciated that in embodiments, such data is pre-established and need not be entered into the computer in accordance with the methods described herein. A thickness of at least one of the bottom high-k layer 23 or the top high-k layer 24 of the MIMCAP device is then pre-determined, wherein the pre-determined thickness is established based upon a pre-determined TDDB lifetime for the MIMCAP device and a minimum target capacitance density at an applied voltage bias to be employed for the MIMCAP device. More particularly, the thickness of the layer at issue is established in a calculated manner based upon the desired pre-determined TDDB lifetime for the MIMCAP device and the minimum target capacitance density at an applied voltage bias, rather than merely arbitrarily established or established based upon architectural and spatial allowances.

In embodiments, the dielectric layer has a thickness configured to provide a capacitance density of greater than or equal to about 20 $fF/cm^2$ and a leakage current of less than 100 $nA/cm^2$ at about 1.5V applied voltage. In embodiments, the MIMCAP device is also configured to have a TDDB reliability lifetime of at least 10 years at about 1.5V applied voltage, and may have a TDDB reliability lifetime in excess of about 20 years.

In an embodiment, the MIMCAP device is configured for uni-polar voltage bias, with one of the bottom high-k layer 23 or the top high-k layer 24 being a ground side layer and the other of the bottom high-k layer 23 or the top high-k layer 24 being a bias side layer. In this embodiment, the thickness is pre-determined for at least the ground side layer based upon the minimum target capacitance density at the applied voltage bias and pre-determined TDDB lifetime for the MIMCAP device. While thickness of the bias side layer may also be pre-determined, the thickness of the bias side layer has a less material impact on TDDB lifetime for the MIMCAP device. Thus, in embodiments, the bias side layer has a lesser thickness than the ground side layer.

In specific embodiments for the MIMCAP device 12 that is configured for uni-polar voltage bias, the applied voltage bias to be employed for the MIMCAP device is about 1.5 volts or less with a target capacitance density of greater than or equal to about 20 $fF/cm^2$, the TDDB lifetime is at least about 10 years, and the ground side layer has a thickness of at least about 20 Å, such as from about 20Å to about 60Å, or such as from about 20Å to about 40Å. In this specific embodiment, the MIMCAP device includes $HfO_2$ in both the bottom high-k layer 23 and the top high-k layer 24 (present in an amount of at least about 90 weight % based on total weight of the bottom high-k layer 23 or the top high-k layer 24). The biased side layer has a thickness of less than about 40Å, such as less than about 20Å, and down to 0Å. The lower-k layer 26 may include $Al_2O_3$ as the lower-K material with the lower-k layer 26 having a thickness of greater than about 10Å, such as from about 10Å to about 20Å.

In another embodiment, the MIMCAP device is configured for bi-polar voltage bias, where the bottom high-k layer 23 and the top high-k layer 24 are both configured for bias. In this embodiment, the thickness of both the bottom high-k layer 23 and the top high-k layer 24 are pre-determined based upon the pre-determined TDDB lifetime for the MIMCAP device and the minimum target capacitance density at an applied voltage bias to be employed for the MIMCAP device. In specific embodiments for the MIMCAP device 12 that is configured for bi-polar voltage bias, the applied voltage bias to be employed for the MIMCAP device is about 1.5 volts or less with a target capacitance density of greater than or equal to about 20 $fF/cm^2$, the TDDB lifetime is at least 10 years, and the bottom high-k layer 23 and the top high-k layer 24 each have a thickness of at least about 20Å, such as from about 20Å to about 60Å, or such as from about 20Å to about 40Å. In this specific embodiment, the MIMCAP device includes $HfO_2$ in both the bottom high-k layer 23 and the top high-k layer 24 (present in an amount of at least 90 weight % based on total weight of the bottom high-k layer 23 or the top high-k layer 24). The lower-k layer 26 may include $Al_2O_3$ as the lower-K material with the lower-k layer 26 having a thickness of greater than about 10Å, such as from about 10Å to about 20Å.

If voltages less than about 1.5V will be used (e. g. for 14 nm node and beyond), leakage current will be even lower and TDDB lifetime even longer compared to that with 1.5V application. In this case, thickness of the various layers can be made thinner than stated above if higher capacitance density is required. For bottom high-K layers and top high-K layers comprising different material than stated above, thicknesses of the bottom high-k layer 23, the lower-k layer 26, and the top high-k layer 24 can be adjusted according to the dielectric constant of each layer and interaction between the layers to meet requirements of capacitance density, leakage current, and TDDB lifetime.

After pre-determining the layer thicknesses, the MIMCAP device is fabricated and conventional deposition, patterning, and etching techniques may be employed in this regard. In embodiments, deposition and annealing temperatures during fabrication of the MIMCAP device are compatible with back-end-of-line processing conditions. For example, in embodiments, deposition and annealing temperatures are from about 300 to about 450° C. Due to the deposition and annealing temperatures, the bottom high-k layer 23, the top high-k layer 24, and the lower-k layer 26 may have a substantially amorphous structure. Generally, higher deposition and annealing temperatures are associated with higher quality of MIMCAP devices, manifested as high capacitance density, low leakage, as well as high TDDB reliability lifetimes, such as those in dynamic random access memory capacitors, which achieve the higher quality by phase-controlled high-k layer(s). At these high temperatures (generally higher than 500° C.), high-K material is crystallized, and certain concentrations of impurity doping (e.g., Al doping into $HfO_2$) can induce phase shift to a preferable phase (e.g. cubic $HfO_2$). However, the higher deposition and annealing temperature associated with phase-controlled high-k layer(s) are incompatible with BEOL processing. Alternative mechanisms for obtaining a specified TDDB reliability lifetime of the MIMCAP devices are provided herein based upon adjusting thicknesses of the bottom high-k layer 23, the top high-k layer 24, and the lower-k layer 26, with the lower deposition and annealing temperatures acceptable for fabrication of the MIMCAP devices without compromising TDDB reliability lifetime.

As a result of the deposition and annealing temperatures for the MIMCAP devices that are compatible with BEOL processing (e.g., 300-450° C.), the bottom high-k layer 23, the top high-k layer 24, and the lower-k layer 26 may (but are not required) have a substantially amorphous structure. By "substantially amorphous", it is meant that there is no identifiable $HfO_2$ peak in x-ray diffraction spectrum of the dielectric layer. However, it is to be appreciated that the substantially amorphous structure is generally a consequence of the deposition and annealing temperature.

A strong correlation is shown between layer thickness and TDDB reliability lifetime. In the case where the positive voltage is applied to top electrode 25, the thicker the bottom high-k layer 23 is, the longer the TDDB lifetime the MIMCAP device can obtain, provided that comparison is made between devices having the same total thickness of the bottom high-k layer 23 and the top high-k layer 24, as well as the same thickness of the lower-k layer 26. A thickness range of the bottom high-k layer 23, the top high-k layer 24, and the lower-k layer 26 is constrained by application requirements, including capacitance density, leakage current, and TDDB lifetime. On the other hand, if the positive voltage is applied to the bottom electrode 20, the thicker the top high-k layer 24 is, the longer the TDDB lifetime the MIMCAP device can obtain, provided that comparison is made between devices having the same total thickness of the bottom high-k layer 23 and the top high-k layer 24, as well as the same thickness of the lower-k layer 26.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. A method of forming an integrated circuit including a metal-insulator-metal capacitor (MIMCAP) device, wherein the method comprises:
   pre-determining a thickness of at least one of a bottom high-K layer or a top high-K layer of the MIMCAP device, wherein the pre-determined thickness is established based upon a pre-determined time-dependent dielectric breakdown (TDDB) lifetime with longer pre-determined TDDB lifetime obtained with greater thickness of the at least one of the bottom high-k layer or the top high-K layer for the MIMCAP device, and wherein the predetermined thickness is further established based upon a minimum target capacitance density at an applied voltage bias to be employed for the MIMCAP device; and
   fabricating the MIMCAP device after pre-determining the thickness of at least one of the bottom high-K layer or the top high-K layer, wherein the MIMCAP device comprises:
   a bottom electrode, a dielectric layer disposed over the bottom electrode and including a stack of individual layers including the bottom high-K layer, the top high-K layer, and a lower-K layer sandwiched between the bottom high-K layer and the top high-K layer, and a top electrode disposed over the dielectric layer, wherein at least one of the bottom high-K layer or the top high-K layer has the pre-determined thickness.

2. The method of claim 1, wherein pre-determining the thickness is conducted by a computer processor applying integrated circuit design software.

3. The method of claim 1, wherein the MIMCAP device is configured for uni-polar voltage bias, wherein one of the bottom high-K layer or the top high-K layer is a ground side layer, and wherein pre-determining the thickness of at least one of the bottom high-K layer or the top high-K layer comprises pre-determining the thickness of the ground side layer based upon the minimum target capacitance density at the applied voltage bias and the pre-determined TDDB lifetime for the MIMCAP device.

4. The method of claim 3, wherein the other of the bottom high-K layer or the top high-K layer is a bias side layer, and wherein the bias side layer has a lesser thickness than the ground side layer.

5. The method of claim 3, wherein the applied voltage bias to be employed for the MIMCAP device is about 1.5 volts or less with a capacitance density of greater than or equal to about 20 $fF/cm^2$, wherein the pre-determined TDDB lifetime is at least about 10 years, and wherein the ground side layer has a thickness of from about 20 Å to about 40 Å.

6. The method of claim 5, wherein the other of the bottom high-K layer or the top high-K layer is a bias side layer, and wherein the bias side layer has a thickness of less than about 20 Å.

7. The method of claim 5, wherein the bottom high-K layer and the top high-K layer individually comprise a dielectric material chosen from $HfO_2$, $ZrO_2$, or a combination thereof.

8. The method of claim 1, wherein the MIMCAP device is configured for bi-polar voltage bias with the bottom high-K layer and the top high-K layer configured for bias, and wherein pre-determining the thickness of at least one of the bottom high-K layer or the top high-K layer comprises pre-determining the thickness of both the bottom high-K layer and the top high-K layer wherein the pre-determined thickness is established based upon the pre-determined TDDB lifetime for the MIMCAP device and the minimum target capacitance density at the applied voltage bias to be employed for the MIMCAP device.

9. The method of claim 8, wherein the applied voltage bias to be employed for the MIMCAP device is about 1.5 volts or less with a capacitance density of greater than or equal to about 20 $fF/cm^2$, wherein the pre-determined TDDB lifetime is at least about 10 years, and wherein the bottom high-K layer and the top high-K layer each have a thickness of from about 20Å to about 40Å.

10. The method of claim 1, wherein the bottom high-K layer or the top high-K layer comprise a dielectric material chosen from $HfO_2$, $ZrO_2$, or a combination thereof.

11. The method of claim 1, wherein deposition and annealing temperatures during fabrication of the MIMCAP device are compatible with back-end-of-line processing conditions.

12. The method of claim 11, wherein deposition and annealing temperatures are from about 300 to about 450° C.

13. The method of claim 11, wherein the bottom high-K layer, the top high-K layer, and the lower-K layer have a substantially amorphous structure.

14. A method of forming an integrated circuit including a metal-insulator-metal capacitor (MIMCAP) device, wherein the method comprises:
  establishing a minimum target capacitance density at an applied voltage bias to be employed for the MIMCAP device;
  establishing a pre-determined time-dependent dielectric breakdown (TDDB) lifetime for the MIMCAP device;
  pre-determining a thickness of at least one of a bottom high-K layer or a top high-K layer of the MIMCAP device, wherein the pre-determined thickness is established based upon the pre-determined TDDB lifetime with longer pre-determined TDDB lifetime obtained with greater thickness of the at least one of the bottom high-k layer or the top high-k layer for the MIMCAP device, and wherein the predetermined thickness is further established based upon the minimum target capacitance density at the applied voltage bias to be employed for the MIMCAP device;
  fabricating the MIMCAP device after pre-determining the thickness of at least one of the bottom high-K layer or the top high-K layer, wherein the MIMCAP device comprises:
    a bottom electrode, a dielectric layer disposed over the bottom electrode and including a stack of individual layers including the bottom high-K layer, the top high-K layer, and a lower-K layer sandwiched between the bottom high-K layer and the top high-K layer, and a top electrode disposed over the dielectric layer, wherein at least one of the bottom high-K layer or the top high-K layer has the pre-determined thickness.

* * * * *